United States Patent
Hashimoto

(10) Patent No.: US 10,664,054 B2
(45) Date of Patent: May 26, 2020

(54) VIBRATING DEVICE

(71) Applicant: Murata Manufacturing Co., Ltd., Nagaokakyo-shi, Kyoto-fu (JP)

(72) Inventor: Junichi Hashimoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 289 days.

(21) Appl. No.: 15/495,002

(22) Filed: Apr. 24, 2017

(65) Prior Publication Data

US 2017/0228020 A1   Aug. 10, 2017

Related U.S. Application Data

(63) Continuation of application No. PCT/JP2015/078141, filed on Oct. 5, 2015.

(30) Foreign Application Priority Data

Oct. 27, 2014  (JP) ................. 2014-218529

(51) Int. Cl.
*G06F 3/041* (2006.01)
*G06F 3/045* (2006.01)
*G06F 3/01* (2006.01)
*G06F 3/02* (2006.01)
(Continued)

(52) U.S. Cl.
CPC ............ *G06F 3/016* (2013.01); *G06F 3/0202* (2013.01); *G06F 3/041* (2013.01); *G06F 3/0416* (2013.01); *H01H 13/85* (2013.01); *H03K 17/9622* (2013.01); *H01H 2215/052* (2013.01); *H03K 2217/96062* (2013.01)

(58) Field of Classification Search
CPC ............. G06F 3/016; G06F 19/00; G06F 1/16
See application file for complete search history.

(56) References Cited

U.S. PATENT DOCUMENTS 2,912,605 A * 11/1959 Tibbetts ................. G10K 9/122
  310/326
3,792,204 A *  2/1974 Murayama ............ H01G 7/023
  310/322
(Continued)

FOREIGN PATENT DOCUMENTS

JP  2005-303937 A  10/2005
JP  2010-146576 A   7/2010
(Continued)

OTHER PUBLICATIONS

International Search Report issued in International Application No. PCT/JP2015/078141, dated Dec. 8, 2015.
(Continued)

*Primary Examiner* — Nan-Ying Yang
(74) *Attorney, Agent, or Firm* — Arent Fox LLP

(57) ABSTRACT

A tactile sense presenting device that includes a piezoelectric film, a first diaphragm and a second diaphragm. The piezoelectric film deforms in a planar direction when a voltage is applied thereto. The first diaphragm and the second diaphragm sandwich the piezoelectric film. Opposed ends of the first diaphragm and opposed ends of the second diaphragm are fixed, respectively, to opposed ends of the piezoelectric film such that the first diaphragm and the second diaphragm are in a warped state.

12 Claims, 4 Drawing Sheets

(51) Int. Cl.
*H01H 13/85* (2006.01)
*H03K 17/96* (2006.01)

(56) References Cited

U.S. PATENT DOCUMENTS

| | | | | |
|---|---|---|---|---|
| 5,471,721 | A * | 12/1995 | Haertling | H01L 41/29 29/25.35 |
| 8,717,151 | B2 * | 5/2014 | Forutanpour | G06F 3/04847 340/407.1 |
| 9,332,353 | B2 | 5/2016 | Ando | |
| 9,363,607 | B2 | 6/2016 | Ando | |
| 2014/0079255 | A1 | 3/2014 | Ando | |
| 2014/0210601 | A1 * | 7/2014 | Sato | G06F 3/041 340/407.2 |
| 2015/0131822 | A1 | 5/2015 | Ando | |
| 2015/0131823 | A1 | 5/2015 | Ando | |
| 2016/0023245 | A1 * | 1/2016 | Zadesky | A61B 5/7455 310/334 |

FOREIGN PATENT DOCUMENTS

| | | |
|---|---|---|
| JP | 2011-175518 A | 9/2011 |
| WO | WO 2012-157691 A1 | 11/2012 |

OTHER PUBLICATIONS

Written Opinion of the International Searching Authority issued in International Application No. PCT/JP2015/078141, dated Dec. 8, 2015.

* cited by examiner

VIBRATING DEVICE

CROSS REFERENCE TO RELATED APPLICATIONS

The present application is a continuation of International application No. PCT/JP2015/078141, filed Oct. 5, 2015, which claims priority to Japanese Patent Application No. 2014-218529, filed Oct. 27, 2014, the entire contents of each of which are incorporated herein by reference.

FIELD OF THE INVENTION

The present invention relates to a vibrating device which causes vibrations.

BACKGROUND OF THE INVENTION

In recent years, a tactile sense presenting device which gives a feedback of touch and a feeling of a keystroke by transmitting vibrations when the user touches a key on a touch panel keyboard has been proposed as an example of a vibrating device.

For example, Patent Document 1 discloses a structure which holds both ends of a piezoelectric bimorph element composed of piezoelectric ceramics or the like by using a low elastic body, and connects a vibrated body to a center of the piezoelectric bimorph element. The structure of Patent Document 1 transmits vibrations to a user via the connected vibrated body by inputting an alternating-current drive signal to the piezoelectric bimorph element to cause vibration.

Further, in some tactile sense presenting devices, a diaphragm is, for example, fixed to a piezoelectric film in a warped state. A touch sensor which detects a touch operation is provided on a principal surface of the diaphragm. This tactile sense presenting device applies a drive signal to the piezoelectric film in response to a user's touch operation, and the piezoelectric film stretches or contracts. When the piezoelectric film stretches or contracts, the diaphragm vibrates, and this vibration transmits to the user.

Patent Document 1: Japanese Patent Application Laid-Open No. 2005-303937

SUMMARY OF THE INVENTION

A tactile sense presenting device which uses a diaphragm and a piezoelectric film holds the diaphragm at a position shifted from opposed ends of the diaphragm to a center to increase vibrations of the diaphragm, and the opposed ends of the diaphragm become antinodes of the vibrations. Hence, when the ends of the diaphragm contact a desk or a wall during vibrations of the diaphragm, the ends of the diaphragm hardly vibrate, and therefore the entire vibration of the diaphragm attenuates.

An object of the present invention is to provide a vibrating device which can cause strong vibrations.

A vibrating device according to the present invention includes a film and a pair of diaphragms. The film deforms in a planar direction when a voltage is applied thereto. A pair of diaphragms are provided sandwiching the film. Opposed ends of the pair of diaphragms are fixed to opposed ends of the film such that the pair of diaphragms are warped.

Amplitudes of vibrations of the diaphragms become greatest when the same drive signal is applied to the film when the gravity centers of the diaphragms do not move during the vibrations of the diaphragms as compared to when the gravity centers of the diaphragms move during the vibrations of the diaphragms. According to the configuration of the present invention, the pair of diaphragms deform such that the centers of the diaphragms are displaced in opposite directions during the vibrations. Hence, the gravity centers of the pair of diaphragms hardly move. As a result, it is possible to increase the amplitudes of the vibrations of the diaphragms.

Further, the amplitudes of the vibrations become smallest at the opposed ends of the diaphragms, so that, even when the ends of the diaphragms contact a desk or a wall during vibrations of the diaphragms, the amplitudes of the vibrations at the ends of the diaphragms hardly change. Consequently, it is possible to reduce an attenuation amount of the entire vibrations of the diaphragms.

In the vibrating device according to the present invention, the pair of diaphragms preferably have identical shapes. According to this configuration, the pair of diaphragms deform such that the centers of the diaphragms are displaced in opposite directions by the same amount during the vibrations. Hence, the gravity centers of the pair of diaphragms hardly move during vibrations. As a result, it is possible to further increase the amplitudes of the vibrations of the diaphragms.

In the vibrating device according to the present invention, the film may be a piezoelectric film made of a piezoelectric resin with electrodes formed on both principal surfaces thereof.

In the vibrating device according to the present invention, the piezoelectric resin may be made of polyvinylidene fluoride.

In the vibrating device according to the present invention, the piezoelectric resin may be made of polylactic acid.

The vibrating device according to the present invention may further include a touch detecting unit and a driving unit. The touch detecting unit is provided at a side of a principal surface of one of the diaphragms opposite to a side of the film, and detects a touch operation. The driving unit applies a drive signal to the film when the touch detecting unit detects the touch operation.

According to this configuration, it is possible to use the vibrating device as a tactile sense presenting device. Further, generally, it is preferably to dispose the touch detecting unit at a portion other than portions at which vibrations of the diaphragms become smallest to vibrate the touch detecting unit. According to the configuration of the present invention, the amplitudes of the vibrations become smallest at the opposed ends of the diaphragms, so that it is possible to sufficiently secure an area at which the touch detecting unit is disposed. Consequently, it is possible to dispose a necessary number of touch detecting units on the diaphragms even when sizes of the diaphragms are made small.

According to the present invention, it is possible to realize a vibrating device which can cause strong vibrations.

DETAILED DESCRIPTION OF THE INVENTION

Figure 1A:
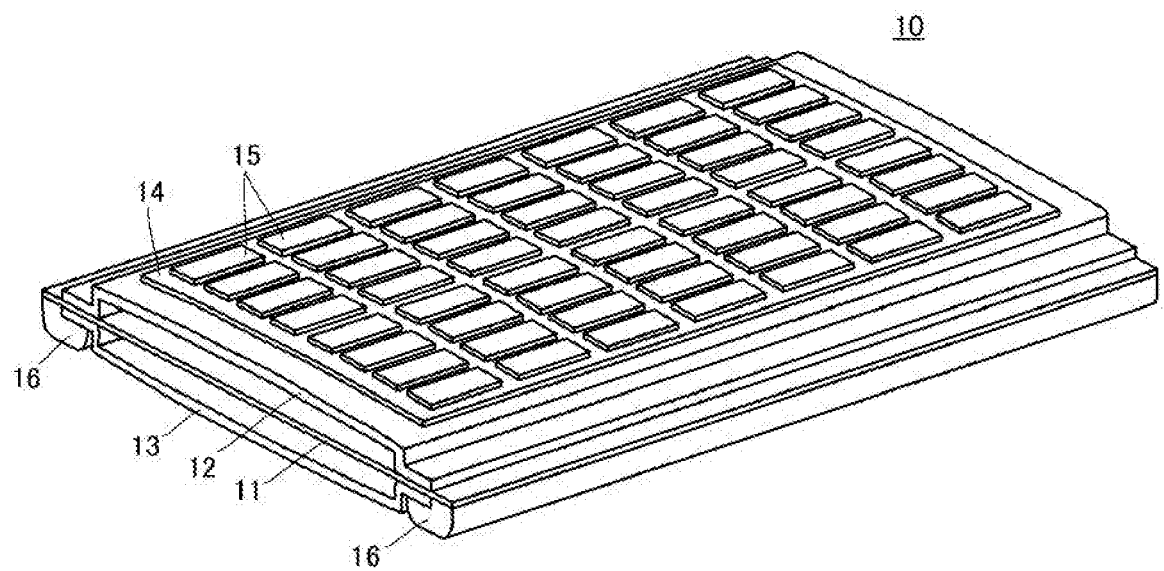
FIG. 1(A) is an external appearance perspective view of a tactile sense presenting device according to the present embodiment.
Figure 1B:
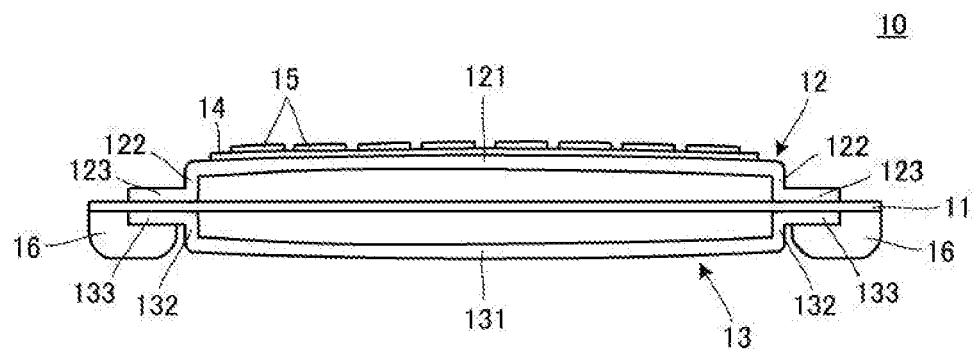
FIG. 1(B) is a side view of the tactile sense presenting device according to the present embodiment.

A tactile sense presenting device 10 according to the present invention will now be described with reference to the drawings. The tactile sense presenting device 10 is an example of a vibrating device according to the present invention. FIG. 1(A) is an external appearance perspective view of the tactile sense presenting device 10. FIG. 1(B) is a side view of the tactile sense presenting device 10. The tactile sense presenting device 10 includes a piezoelectric film 11, a diaphragm 12, a diaphragm 13, a film switch 14 and holding portions 16. The piezoelectric film 11 corresponds to an example of a "film" according to the present invention.

The diaphragm 12 is provided at an upper surface side of the piezoelectric film 11. The diaphragm 13 is provided at a lower surface side of the piezoelectric film 11. The film switch 14 is provided on an upper surface of the diaphragm 12. Opposed ends of the diaphragm 12 and the diaphragm 13 are fixed to respective opposed ends of the piezoelectric film 11 such that the diaphragm 12 and the diaphragm 13 are in a warped state. The opposed ends of the diaphragm 13 are held by the holding portions 16.

The piezoelectric film 11 is formed by forming electrodes on both principal surfaces of a base film of a rectangular flat shape. The base film is a piezoelectric resin, and a material therefore is polyvinylidene fluoride (PVDF), chiral polymers and the like. Further, the chiral polymer is, for example, poly-L-lactic acid (PLLA).

When the PVDF is used for the piezoelectric film 11, the PVDF has water resistance, so that it is possible to provide the same click feeling even when, for example, an electronic device including the tactile sense presenting device is put under various temperature and humidity environments.

Further, when the PLLA is used for the piezoelectric film 11, the PLLA is a material of high transparency. Therefore, when a transparent material is used for the electrodes added to the PLLA, the diaphragm 12 and the diaphragm 13, and, when a vibrating body composed of the piezoelectric film 11, the diaphragm 12 and the diaphragm 13 are manufactured, it is possible to provide an advantage of visually checking an internal state of the vibrating body. Further, by disposing a light emission source such as a light inside the vibrating body, it is possible to visually check key positions of the components, even in a dark place. Furthermore, the PLLA has no pyroelectricity, and provides an advantage of providing a similar click feeling under many different temperature environments. Still further, when the PLLA is used for the piezoelectric film 11, the piezoelectric film 11 is preferably disposed such that a direction of +45±10° or −45±10° from a stretching direction is nearly parallel to a lateral direction of the diaphragms (a direction in which a tensile force is applied).

Deposited electrodes such as aluminum (Al) or copper (Cu) are preferably used for electrodes of the piezoelectric film 11. In this regard, in case where the electrodes of the piezoelectric film 11 need transparency, an electrode material whose main components are indium tin oxide (ITO), zinc oxide (ZnO) and polythiophene or a silver nanowire electrode material is preferably used. Further, an electrode material whose component is carbon such as carbon nanotubes or carbon fibers may be used for the electrodes of the piezoelectric film 11. The electrodes of the piezoelectric film 11 are connected to a driving unit 17 (see FIG. 3) with lead wiring conductors interposed therebetween. The piezoelectric film 11 stretches or contracts in a lateral direction of the piezoelectric film 11 when a voltage is applied to the electrodes. That is, the piezoelectric film 11 deforms in a planar direction when a voltage is applied thereto.

The diaphragm 12 has a nearly rectangular flat shape, and has substantially the same size as that of the piezoelectric film 11 when seen from a plan view. The diaphragm 12 is composed of a center 121, side surfaces 122 and opposed ends 123. The center 121 has a rectangular flat shape. The side surfaces 122 extend from the ends of the center 121 in the lateral direction to a direction vertical with respect to a principal surface of the center 121. The opposed ends 123 extend outwardly from ends of the side surfaces 122 in a direction parallel to the principal surface of the center 121. The diaphragm 12 is made by using, for example, a metal material (steel plate SPCC, stainless steel SUS301CSP or SUS304CSP, beryllium copper C1700 or C1720, phosphor bronze C5210 or nickel silver C7701), a resin material (PMMA, PET and PC) and glass as materials. The side surfaces 122 and the ends 123 of the diaphragm 12 are formed by, for example, bending both ends of a metal plate. The diaphragm 13 is composed of a center 131, side surfaces 132 and opposed ends 133, and is composed similar to the diaphragm 12.

The diaphragm 12 is disposed such that a side at which the side surfaces 122 of the diaphragm 12 extends faces a side of the piezoelectric film 11. The opposed ends 123 of the diaphragm 12 are fixed to respective opposed ends of the piezoelectric film 11 in the lateral direction. Lower surfaces of the opposed ends 123 of the diaphragm 12 are in contact with upper surfaces of the respective opposed ends of the piezoelectric film 11 in the lateral direction. A hollow area is formed between the center 121 of the diaphragm 12 and the piezoelectric film 11.

The diaphragm 13 is disposed such that a side at which the side surfaces 132 of the diaphragm 13 extend faces the side of the piezoelectric film 11. The opposed ends 133 of the diaphragm 13 are fixed to the respective opposed ends of the piezoelectric film 11 in the lateral direction. Upper surfaces of the opposed ends 133 of the diaphragm 13 are in contact with lower surfaces of the respective opposed ends of the piezoelectric film 11 in the lateral direction. A hollow area is formed between the center 131 of the diaphragm 13 and the piezoelectric film 11. The opposed ends 123 of the diaphragm 12 and the opposed ends 133 of the diaphragm 13 are disposed at identical positions when seen from the plan view.

The film switch 14 of a rectangular flat shape is provided on the upper surface of the center 121 of the diaphragm 12. The film switch 14 is provided with a plurality of touch sensors 15 at positions corresponding to, for example, a key alignment. The touch sensors 15 detect a user's touch operation. Each touch sensor 15 is an example of a "touch detecting unit" according to the present invention. The film switch 14 is, for example, a membrane switch or a capacitive film switch.

Each holding portion 16 preferably has a nearly cuboid shape and is disposed along the opposed ends 133 of the diaphragm 13. Upper surfaces of the holding portions 16 are in contact with lower surfaces of the opposed ends 133 of the diaphragm 13 and the lower surfaces of the respective opposed ends of the piezoelectric film 11 in the lateral direction. The holding portions 16 hold the opposed ends 133 of the diaphragm 13 and the respective opposed ends of the piezoelectric film 11 in the lateral direction. Thus, the holding portions 16 hold the piezoelectric film 11, the diaphragm 12 and the diaphragm 13 in a floating state.

In this regard, the piezoelectric film does not need to have a size which overlaps the diaphragms when seen from the plan view, and a plurality of piezoelectric films having strip shapes may be disposed at intervals in the longitudinal direction of the diaphragms.

Figure 2A:
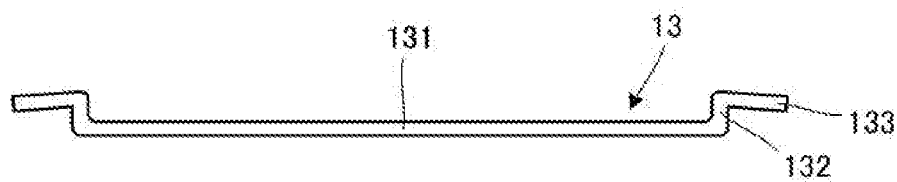
FIGS. 2(A) to 2(E) are side views illustrating a process of combining a piezoelectric film 11, a diaphragm 12 and a diaphragm 13.
Figure 2B:
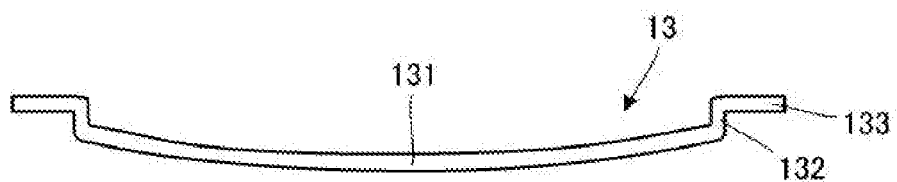
Figure 2C:
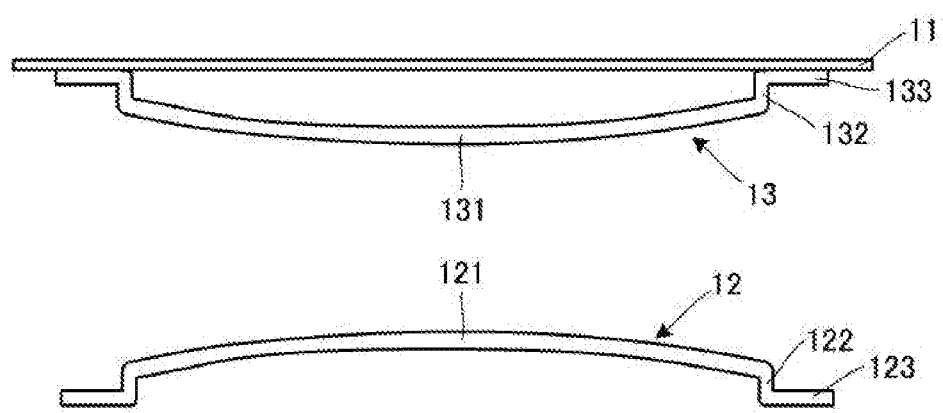

FIGS. 2(A) to 2(E) are side views illustrating a process of combining the piezoelectric film 11, the diaphragm 12 and the diaphragm 13. These figures are exaggerated (in a thickness direction in particular) for ease of understanding, and an actual tactile sense presenting device is relatively thin and substantially flat. This applies to FIGS. 4(A), 4(B), 5(A) and 5(B) as well. As illustrated in FIG. 2(A), the diaphragm 13 is disposed such that the side at which the side surfaces 132 of the diaphragm 13 extend faces an upper direction. Next, as illustrated in FIG. 2(B), the center 131 of the diaphragm 13 is warped to hold the diaphragm 13 such that the upper surface of the center 131 of the diaphragm 13 is recessed along the lateral direction of the center 131. Next, as illustrated in FIG. 2(C), the respective opposed ends of the piezoelectric film 11 in the lateral direction are attached to the opposed ends 133 of the diaphragm 13. Further, when the diaphragm 13 which is held is released, the degree of warp of the diaphragm 13 decreases and the piezoelectric film 11 stretches or contracts in the lateral direction.

Figure 2D:
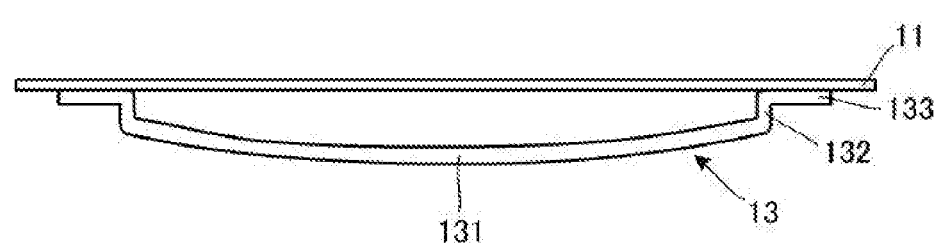
Figure 2E:
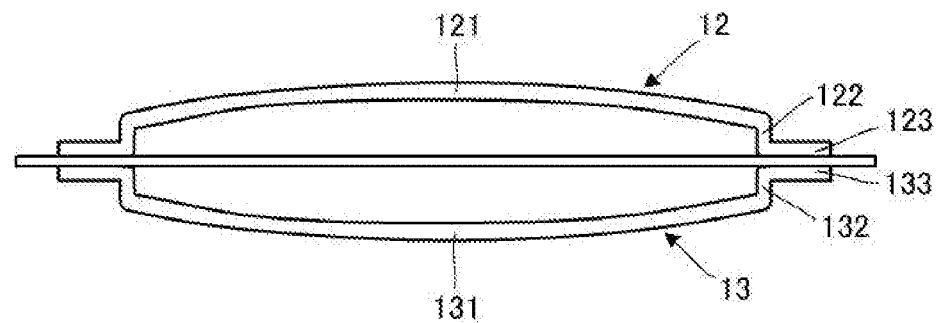

Next, as illustrated in FIG. 2(D), the diaphragm 12 is disposed at the upper surface side of the piezoelectric film 11 such that the side at which the side surfaces 122 of the diaphragm 12 extend faces a lower direction. Further, the center 121 of the diaphragm 12 is warped to hold the diaphragm 12 such that the upper surface of the center 121 of the diaphragm 12 is recessed along the lateral direction of the center 121. In this regard, the center 121 of the diaphragm 12 is warped such that the opposed ends 123 of the diaphragm 12 and the opposed ends 133 of the diaphragm 13 are disposed at identical positions when seen from the plan view. Next, as illustrated in FIG. 2(E), the respective opposed ends of the piezoelectric film 11 in the lateral direction are attached to the opposed ends 123 of the diaphragm 12. According to the above process, the piezoelectric film 11, the diaphragm 12 and the diaphragm 13 are fixed in a state where rigidity of the diaphragm 12 and the diaphragm 13 allows the piezoelectric film 11 to stretch or contract and a tensile force of the piezoelectric film 11 warps the diaphragm 12 and the diaphragm 13.

Figure 3:
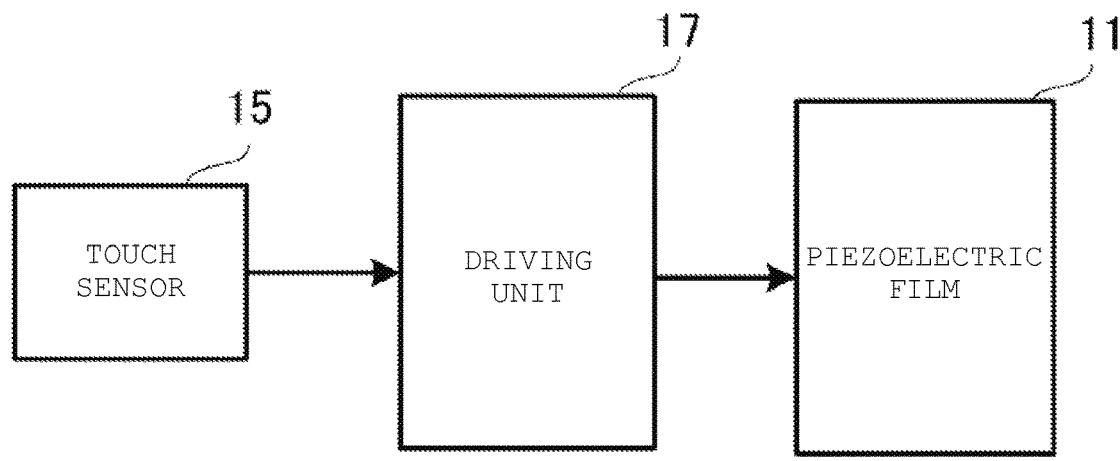
FIG. 3 is a block diagram illustrating a configuration of the tactile sense presenting device according to the present embodiment.

FIG. 3 is a block diagram illustrating a configuration of the tactile sense presenting device 10. When the user touches each touch sensor 15, the driving unit 17 applies a drive signal (drive voltage) to the electrodes of the piezoelectric film 11. Thus, the piezoelectric film 11 stretches or contracts.

Figure 4A:
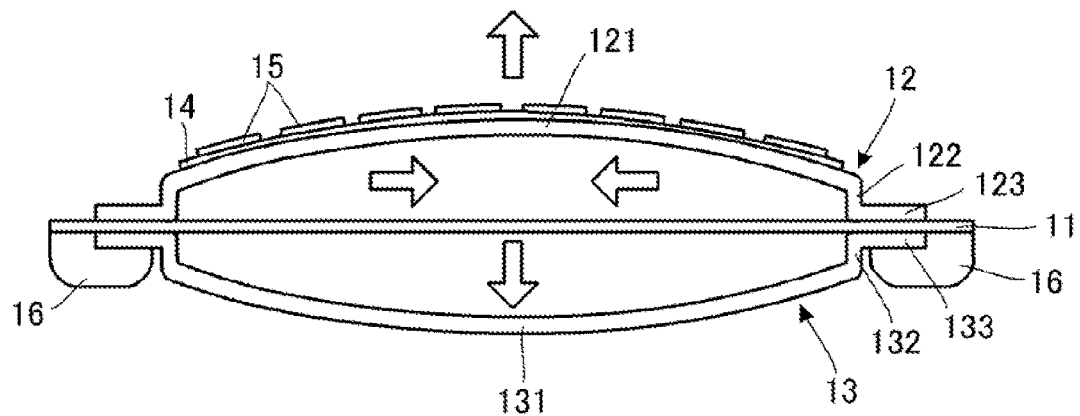
FIGS. 4(A) and 4(B) are side views explaining an operation of the tactile sense presenting device according to the present embodiment.
Figure 4B:
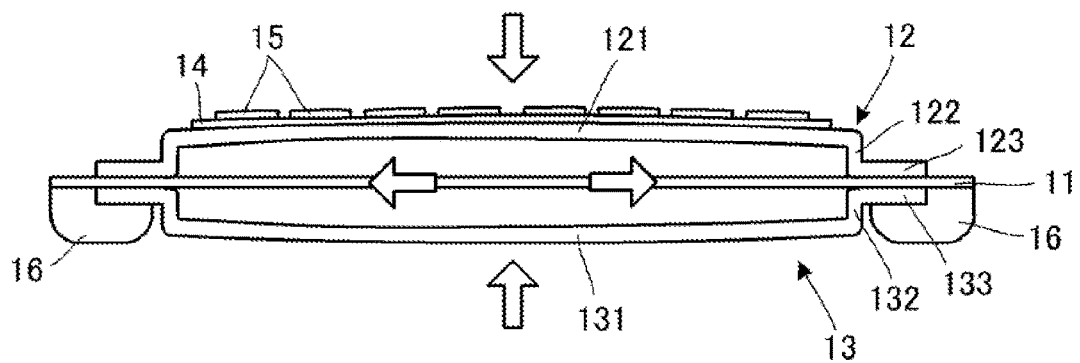

FIGS. 4(A) and 4(B) are side views explaining an operation of the tactile sense presenting device 10. As illustrated in FIG. 4(A), when a drive voltage is applied to the piezoelectric film 11 in a predetermined direction, the piezoelectric film 11 contracts in the lateral direction. When the piezoelectric film 11 contracts, the opposed ends of the diaphragm 12 and the diaphragm 13 approach each other, and the center 121 of the diaphragm 12 and the center 131 of the diaphragm 13 significantly warp. That is, the center 121 of the diaphragm 12 and the center 131 of the diaphragm 13 deform further protruding toward a side opposite to the side of the piezoelectric film 11.

Next, as illustrated in FIG. 4(B), when a drive voltage is applied to the piezoelectric film 11 in a direction opposite to a predetermined direction, the piezoelectric film 11 stretches in the lateral direction. When the piezoelectric film 11 stretches, restoring forces of the diaphragm 12 and the diaphragm 13 move the opposed ends of the diaphragm 12 and the diaphragm 13 move away from each other, and the center 121 of the diaphragm 12 and the center 131 of the diaphragm 13 warp towards the piezoelectric film 11.

Thus, the diaphragm 12 and the diaphragm 13 vibrate in upper and lower directions according to a drive signal. Vibrations of the diaphragm 12 are transmitted to the user who has touched the touch sensor 15. Consequently, the user can experience a feeling of a keystroke. In this regard, the diaphragm 13 is preferably not in contact with a housing or the like in which the tactile sense presenting device 10 is housed. Consequently, it is possible to increase the amplitudes of the vibrations of the diaphragm 12 and the diaphragm 13.

Figure 5A:
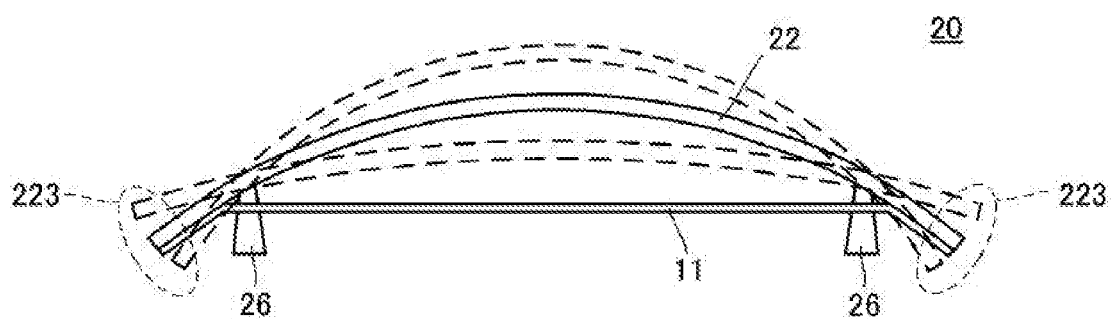
FIG. 5(A) is a schematic side view illustrating a vibration mode of a tactile sense presenting device according to a comparative example.

FIG. 5(A) is a schematic side view illustrating a vibration mode of a tactile sense presenting device 20 according to a comparative example. The tactile sense presenting device 20 includes the piezoelectric film 11, a diaphragm 22 and holding portions 26. The diaphragm 22 has a rectangular flat shape. Ends 223 of the diaphragm 22 in the lateral direction are fixed to the ends of the piezoelectric film 11 in the lateral direction, respectively. The diaphragm 22 warps and protrudes toward a side opposite to the side of the piezoelectric film 11. The holding portions 26 hold the diaphragm 22 near the ends 223 of the diaphragm 22. Touch sensors (not illustrated) which detect a touch operation are provided on an upper surface of the diaphragm 22. The piezoelectric film 11 is connected with a driving unit (not illustrated) which drives the piezoelectric film 11.

When the user touches each touch sensor, the driving unit applies an alternating-current drive signal to electrodes of the piezoelectric film 11. When the drive signal is applied to the piezoelectric film 11, the piezoelectric film 11 stretches or contracts. When the piezoelectric film 11 stretches or contracts, a center of the diaphragm 22 vibrates in the upper and lower directions.

Amplitudes of vibrations of the diaphragms become greatest when the same drive signal is applied to the piezoelectric film when the gravity centers of the diaphragms do not move during the vibrations of the diaphragms compared to when the gravity centers of the diaphragms move during the vibrations of the diaphragms. Meanwhile, when the diaphragm 22 is held at the ends 223 of the diaphragm 22, a gravity center of the diaphragm 22 moves during vibrations of the diaphragm 22. Hence, when the diaphragm 22 is held at the ends 223 of the diaphragm 22, even if the same drive signal is applied to the piezoelectric film 11, the amplitude of the vibration of the diaphragm 22 decreases. Further, the tactile sense presenting device 20 includes the holding portions 26 at positions shifted from the ends 223 of the diaphragm 22 towards the center. In this case, the amplitude of the vibration of the diaphragm 22 becomes greatest not only at the center of the diaphragm 22 but also at the ends 223 of the diaphragm 22. Hence, when the ends 223 of the diaphragm 22 contact a desk or a wall during the vibrations of the diaphragm 22, the ends 223 of the diaphragm 22 hardly vibrate, and therefore the entire vibration of the diaphragm 22 attenuates.

Further, it is necessary to dispose the touch sensors on the upper surface of the diaphragm 22 similar to the key alignment of the keyboard. Meanwhile, it is necessary to dispose the touch sensors at locations other than those at which the holding portions 26 are provided to vibrate the touch sensors. Hence, the touch sensors are disposed closer to a center side of the upper surface side of the diaphragm 22 than the locations at which the holding portion 26 are provided. However, since the holding portions 26 are provided at locations shifted from the ends 223 towards the center side in the tactile sense presenting device 20, locations on the upper surface of the diaphragm 22 at which the touch sensors can be disposed are limited. Hence, a size of the diaphragm 22 is increased to allow a necessary number of the touch sensors to be disposed on the upper surface of the diaphragm 22.

Figure 5B:
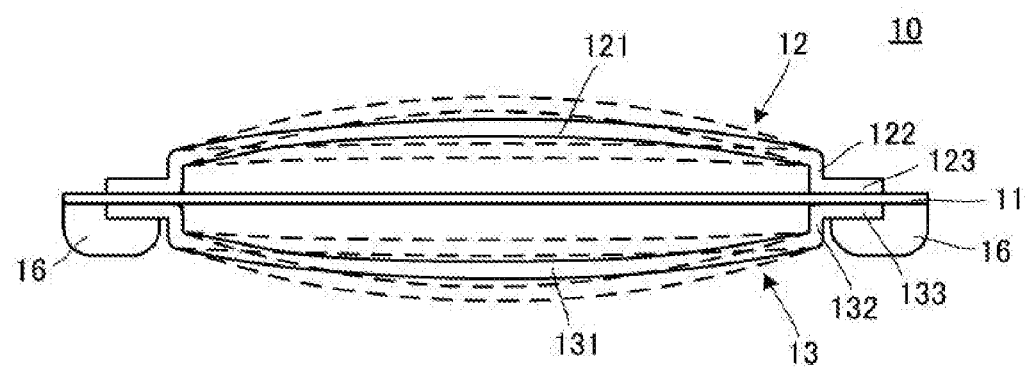
FIG. 5(B) is a schematic side view illustrating a vibration mode of the tactile sense presenting device according to the present embodiment.

FIG. 5(B) is a schematic side view illustrating a vibration mode of the tactile sense presenting device 10 of the present invention.

The diaphragm 12 and the diaphragm 13 deform such that the center 121 and the center 131 are displaced by the same amount in opposite directions during vibrations. Further, the diaphragm 12 and the diaphragm 13 are held at their opposed ends 123 and 133. Hence, a gravity center of the vibrating body composed of the diaphragm 12 and the diaphragm 13 hardly moves during vibrations. As a result, it is possible to increase the amplitudes of the vibrations of the diaphragm 12 and the diaphragm 13.

Further, the opposed ends 123 of the diaphragm 12 and the opposed ends 133 of the diaphragm 13 become nodes, so that the amplitudes of the vibrations of the opposed ends 123 and the opposed ends 133 become small. Hence, when the diaphragm 12 and the diaphragm 13 vibrate, even if the opposed ends 123 and the opposed ends 133 contact a desk or a wall, the amplitudes of the vibrations of the opposed ends 123 and the opposed ends 133 hardly change. As a result, it is possible to reduce the entire vibrations of the diaphragm 12 and the diaphragm 13.

Further, the holding portions 16 are provided at the opposed ends of the diaphragm 12 and the diaphragm 13. Hence, it is possible to sufficiently secure an area at which the touch sensors 15 are disposed. Consequently, it is possible to dispose a necessary number of the touch sensors 15 on the diaphragm 12 even when the sizes of the diaphragm 12 and the diaphragm 13 are made small.

In addition, in the present embodiment, the diaphragm 12 and the diaphragm 13 have the same shape. However, the present invention is not limited to this. According to the present invention, even when the opposed ends of the pair of diaphragms are held, if the gravity centers of the pair of diaphragms hardly move during vibrations, the pair of diaphragms may have different shapes.

Further, in the present embodiment, the diaphragm 12 and the diaphragm 13 are held at their respective opposed ends. However, the present invention is not limited to this. According to the present invention, if the gravity centers of the pair of diaphragms hardly move during vibrations, the pair of diaphragms may be held at portions other than the opposed ends thereof.

Further, "a film which deforms in a planar direction when a voltage is applied thereto" is not limited to the piezoelectric film. For example, an electrostriction film, an electret film, a composite film, an electroactive film or the like can be used.

The electroactive film refers to a film which is electrically driven to produce a stress or a film which is electrically driven to deform and cause a displacement. More specifically, the electroactive film includes an electrostriction film, a composite material (a material formed by sealing piezoelectric ceramics with resin), an electric drive elastomer or a liquid crystal elastomer.

"A film which deforms in a planar direction when a voltage is applied thereto" can be realized by using a piezoelectric film and a resin film (exciter film) which does not have piezoelectricity. In this case, the piezoelectric film is adhered to a principal surface of the exciter film, and ends of the exciter film are connected to the diaphragms.

Further, "a film which deforms in a planar direction when a voltage is applied thereto" can be realized by using a piezoelectric ceramics and a plurality of exciter films. In this case, the plurality of exciter films have one end connected to the piezoelectric ceramics, and the other end connected to the diaphragms.

Further, "a film which deforms in a planar direction when a voltage is applied thereto" may be a single layer or may be a laminated layer. It is possible to provide stronger vibrations by increasing the number of laminated layers.

The tactile sense presenting device has been described as an example of the present invention in the present embodiment. However, the present invention can be also used as the vibrating device such as a speaker only for a vibrating portion.

DESCRIPTION OF REFERENCE SYMBOLS 10, 20: TACTILE SENSE PRESENTING DEVICE
11: PIEZOELECTRIC FILM (FILM)
12, 13, 22: DIAPHRAGM
14: FILM SWITCH
15: TOUCH SENSOR (TOUCH DETECTING UNIT)
16, 26: HOLDING UNIT
17: DRIVING UNIT
121, 131: CENTER
122, 132: LATERAL PORTION
123, 133, 223: END

The invention claimed is:
1. A vibrating device comprising:
a film which deforms in a planar direction when a voltage is applied thereto, the film having a first principal surface, a second principal surface opposite the first principal surface, and first and second opposed ends;
a first diaphragm having third and fourth opposed ends;
a second diaphragm having fifth and sixth opposed ends, wherein the third and fourth opposed ends of the first diaphragm and the fifth and sixth opposed ends of the second diaphragm are fixed, respectively, to the first and second opposed ends of the film such that the first and the second diaphragms are warped and the film is sandwiched between the first and the second diaphragms;
a rectangular flat film switch on a center of a surface of the first diaphragm such that the first diaphragm is between the rectangular flat film switch and the film which deforms in the planar direction;
a touch detecting unit on the rectangular flat film switch, the touch detecting unit detecting a touch operation;
a first holding portion holding the fifth end of the second diaphragm to the first end of the film; and
a second holding portion holding the sixth end of the second diaphragm to the second end of the film,
wherein the first and second holding portions are dimensioned so as to hold the film which deforms in the planar direction, the first diaphragm, and the second diaphragm in a floating state.

2. The vibrating device according to claim 1, wherein the first and the second diaphragms have identical shapes.

3. The vibrating device according to claim 2, wherein the film is a piezoelectric film made of a piezoelectric resin with electrodes on opposed principal surfaces thereof.

4. The vibrating device according to claim 3, the piezoelectric resin is polyvinylidene fluoride.

5. The vibrating device according to claim 3, wherein the piezoelectric resin is polylactic acid.

6. The vibrating device according to claim 1, wherein the film is a piezoelectric film made of a piezoelectric resin with electrodes on opposed principal surfaces thereof.

7. The vibrating device according to claim 6, the piezoelectric resin is polyvinylidene fluoride.

8. The vibrating device according to claim 6, wherein the piezoelectric resin is polylactic acid.

9. The vibrating device according to claim 1, wherein the third and fourth opposed ends of the first diaphragm are respectively fixed to the first and second opposed ends of the film such that a first hollow area is between the center of the first diaphragm and the film.

10. The vibrating device according to claim 9, wherein the fifth and sixth opposed ends of the second diaphragm are respectively fixed to the first and second opposed ends of the film such that a second hollow area is between a center of the second diaphragm and the film.

11. The vibrating device according to claim 1, wherein the fifth and sixth opposed ends of the second diaphragm are respectively fixed to the first and second opposed ends of the film such that a hollow area is between a center of the second diaphragm and the film.

12. The vibrating device according to claim 1, further comprising:
    a driving unit which, when the touch detecting unit detects the touch operation, applies a drive signal to the film.

* * * * *